(12) United States Patent
Robert et al.

(10) Patent No.: US 9,061,895 B2
(45) Date of Patent: Jun. 23, 2015

(54) MICROMECHANICAL STRUCTURE COMPRISING A MOBILE PART HAVING STOPS FOR OUT-OF PLANE DISPLACEMENTS OF THE STRUCTURE AND ITS PRODUCTION PROCESS

(75) Inventors: Philippe Robert, Grenoble (FR); Arnaud Walther, Grenoble (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 885 days.

(21) Appl. No.: 12/974,540

(22) Filed: Dec. 21, 2010

(65) Prior Publication Data
US 2011/0147860 A1 Jun. 23, 2011

(30) Foreign Application Priority Data
Dec. 22, 2009 (FR) ...................................... 09 59412

(51) Int. Cl.
*B81C 1/00* (2006.01)
*B81B 3/00* (2006.01)
(Continued)

(52) U.S. Cl.
CPC ....... *B81C 1/00476* (2013.01); *H04R 2201/003* (2013.01); *B81B 3/0051* (2013.01);
(Continued)

(58) Field of Classification Search
CPC .............. G01P 15/125; G01P 15/0802; H04R 2201/003; B81B 3/001; B81B 3/0013; B81B 3/0021; B81B 3/0035; B81B 3/0051; B81C 1/00158; B81C 1/00166; B81C 1/00182; B81C 1/00468; B81C 1/00476; B81C 1/00484; B81C 1/0096; B81C 1/00976; B81C 1/00984

USPC ................................................. 438/50, 52, 53
See application file for complete search history.

(56) References Cited

U.S. PATENT DOCUMENTS

| 5,181,156 A | 1/1993 | Gutteridge et al. |
| 5,750,420 A | 5/1998 | Bono et al. |

(Continued)

FOREIGN PATENT DOCUMENTS

| DE | 10 2006 011 545 A1 | 9/2007 |
| JP | 2-260333 | 10/1990 |

(Continued)

OTHER PUBLICATIONS

French Preliminary Search Report issued Sep. 15, 2010, in Patent Application No. 0959412 (with English Translation of Category of Cited Documents).

(Continued)

*Primary Examiner* — Stephen W Smoot
*Assistant Examiner* — Sun M Kim
(74) *Attorney, Agent, or Firm* — Oblon, McClelland, Maier & Neustadt, L.L.P.

(57) ABSTRACT

A process for producing a micromechanical structure including a substrate and a stack of at least two layers arranged on the substrate is provided. A mobile part is formed in the stack and a fixed part relative to the substrate is formed in the stack, and an opposite surface is formed between the fixed part and the mobile part, to present a stop device to limit displacement of the mobile part in a direction substantially perpendicular to the stack. The process uses at least one sacrificial layer between the substrate and the stack made of material suitable to be etched selectively relative to the materials of the stack.

12 Claims, 12 Drawing Sheets

(51) Int. Cl.
  *G01P 15/08* (2006.01)
  *G01P 15/125* (2006.01)
(52) U.S. Cl.
  CPC ......... *B81C1/00984* (2013.01); *G01P 15/0802* (2013.01); *G01P 15/125* (2013.01); *G01P 2015/0817* (2013.01)

(56) References Cited

U.S. PATENT DOCUMENTS

| | | | |
|---|---|---|---|
| 7,585,744 B2* | 9/2009 | Gogoi et al. | 438/422 |
| 8,783,107 B2 | 7/2014 | Robert et al. | |
| 2004/0121564 A1 | 6/2004 | Gogoi | |
| 2004/0245586 A1 | 12/2004 | Partridge et al. | |
| 2005/0156260 A1 | 7/2005 | Partridge et al. | |
| 2006/0144143 A1 | 7/2006 | Gogoi et al. | |
| 2007/0222011 A1 | 9/2007 | Robert et al. | |
| 2008/0074725 A1* | 3/2008 | Pan | 359/291 |
| 2008/0179988 A1* | 7/2008 | Jeong et al. | 310/309 |
| 2008/0290430 A1* | 11/2008 | Mahadevan et al. | 257/418 |
| 2009/0152654 A1 | 6/2009 | Classen et al. | |
| 2010/0132463 A1 | 6/2010 | Caminada et al. | |
| 2010/0186506 A1 | 7/2010 | Robert | |
| 2010/0212425 A1* | 8/2010 | Hsu et al. | 73/514.32 |
| 2014/0331770 A1 | 11/2014 | Jourdan et al. | |

FOREIGN PATENT DOCUMENTS

| | | |
|---|---|---|
| JP | 2007-259439 | 10/2007 |
| JP | 2007-316056 | 12/2007 |

OTHER PUBLICATIONS

Chuanwei Wang, et al., "A novel CMOS out-of-plane accelerometer with fully differential gap-closing capacitance sensing electrodes", Journal of Micromechanics and Microengineering, vol. 17, 2007, pp. 1275-1280.

"Inteligent Sensors & Galvanic Isolation", Analog Devices, 4Q, 2007, 87 pages.

Mark S. Fan, et al., "Dynamic Response Assessment for the MEMS Accelerometer Under Severe Shock Loads", NASA/TP, 209978, Oct. 2001, 74 pages.

Yoshiyuki Watanabe, et al., "SOI micromachined 5-axis motion sensor using resonant electrostatic drive and non-resonant capacitive detection mode", Sensors and Actuators A, vol. 130-131, Aug. 14, 2006, pp. 116-123.

Kun Zhang, et al., "Wafer-Level Sandwiched Packaging for High-Yield Fabrication of High-Performance MEMS Inertial Sensors", Micro Electro Mechanical Systems, IEEE 21$^{st}$ International Conference, Jan. 13-17, 2008, pp. 814-817.

Office Action issued in Japanese Patent Application No. 2010-286052 on Jan. 13, 2015 (w/ English Translation).

* cited by examiner

MICROMECHANICAL STRUCTURE COMPRISING A MOBILE PART HAVING STOPS FOR OUT-OF PLANE DISPLACEMENTS OF THE STRUCTURE AND ITS PRODUCTION PROCESS

TECHNICAL FIELD AND PRIOR ART

The present invention relates to micro-electro-mechanical systems or MEMS (Micro-Electro-Mechanical Systems) and to nano-electro-mechanical systems or NEMS (Nano-Electro-Mechanical Systems).

These systems comprise an active structure composed of a fixed element and a mobile element, the mobile element being suspended relative to the fixed element and able to move relative to the fixed element. The fixed element is deposited on a substrate and the active structure is covered with a protective cover.

These systems can be used as sensors, for example as an accelerometer, gyrometer, magnetometer, etc. The mobile element or suspended mass is set in motion by external forces; its displacement relative to the fixed element is measured, for example in the form of a variation in capacity. These measurements deduce variations in acceleration of a vehicle for example.

The mobile element is therefore intended to move, in a plane and/or out of plane. The extent of displacement of the mobile element is taken into account to dimension the system, especially to fix the spaces between the elements. However, it is necessary to limit the extent of displacement for different reasons:
- to prevent mechanical rupture of the component for example, when displacement of the mobile element is due to shock,
- to prevent the mobile element, at a certain potential, from making a short circuit with another element of the component placed at another potential. For example, in the case of an accelerometer with interdigitated combs, the aim is to avoid a short circuit between the mobile capacitive combs and opposite fixed combs, and/or,
- to at least reduce the risk of the mobile part sticking on the substrate, the protective cover (or packaging) or any other fixed part of the component, under the effect of shock for example.

For this purpose, stops are provided, especially for limiting out-of-plane displacements of the mobile part, and preventing contact with certain elements.

Such stops are for example disclosed in document U.S. Pat. No. 5,750,420, being arranged between the substrate or a wafer support and the mobile part. These stops limit downward movements.

Document US 2006/0 144 143 describes stops arranged between the protective cover and the mobile part, obtained by transfer of a second wafer or by deposit of a cover layer, and limiting upward movements.

These stops therefore limit out-of-plane displacement of the mobile part.

However, producing these stops means that the gap between the stop and the mobile element is directly dependent on the MEMS/cover or MEMS/substrate gap. Now, these gaps are determined, either by the thickness of the seal, and by the tolerances on the thickness of sealing bead during execution of the transfer technology, or by the design of the component itself. In fact, the distance separating the mobile structure from the substrate or the cover is decisive with respect to parasite MEMS/substrate or MEMS/cover capacities and also influences the damping of the MEMS.

In this case, the gap is generally limited to heights at least equal to 2 μm or 3 μm, with tolerances of the order of 0.5 μm.

This lower limit is particularly harmful in the case of highly rigid structures, of sensor type with strain gauge detection, for example of piezoresistive gauge or resonator type, which tolerate only minor displacements of the mobile part. In this case, the displacements tolerated (prior to buckling or rupture of the component) can be limited to a few tens or hundreds of nanometers. These maximal displacements are therefore well below distances separating the MEMS from its cover or its support. The performances of the MEMS and its bulk are therefore not optimal.

In addition, in the event where the system comprises an upper stop and a lower stop, it can be best if the latter are symmetrical, more particularly if the gap between the mobile structure and the upper and lower stops is substantially identical. Now, the production process of these stops of the prior art means not making the upper stops and lower stops at the same time. In fact, the upper stops are made by sealing a cover and the lower stops are made by partial etching of the MEMS, or the upper and lower stops are made by transfer of wafers, though with different types of seal and therefore different controls and different gap tolerances. It is not possible to control the symmetry between high and low stops.

There are also sensors and MEMS or NEMS actuators whereof displacement of the mobile part in normal operation is out of plane. In the case of sensors, for example gyroscopes, these comprise detection electrodes detecting when they move closer or move away, and in the case of actuators, these comprise actuating electrodes which move closer or move away when a difference in potential is applied to them.

Now processes of the prior art for making out-of-plane MEMS and NEMS sensors or actuators are complex, long and costly.

The document by C. Wang et al, "A novel CMOS out-of-plane accelerometer with fully differential gap-closing capacitance-sensing electrodes", J. Micromech. Microeng., Vol. 17, p 1275-1280, 2007 describes an out-of-plane detection accelerometer made using CMOS technology. This accelerometer comprises a substrate and an active part. The active part comprises a support frame suspended by beams above the substrate and a mobile mass connected to the support frame by springs. The active part comprises a stack of layers of $SiO_2$ and aluminium, the aluminium forming the electrodes.

The active part relative to the substrate and the mobile mass relative to the support frame are released by chemical etching of the aluminium. Now, so as not to etch the electrodes also formed in aluminium, the latter need to be encapsulated during deposit. Also, for vertical releasing, "sacrificial" paths need to be made during deposit. Apart from this, the complexity of the production process, the dimensions of the vertical gaps are considerably limited by the process itself. In addition, this architecture limits the choice of dimensions of the vertical and horizontal gaps and the active part, since they are interdependent.

DISCLOSURE OF THE INVENTION

It is consequently an aim of the present invention to provide a simplified production process of a MEMS or NEMS system comprising an active structure formed by a stack of layers on a substrate of a mobile part and a fixed part, the fixed and mobile parts comprising opposite surfaces, these surfaces able to form for example stops, detection or actuation electrodes as per application of the system.

The above aim is attained by a production process of a MEMS or NEMS system such as defined hereinabove, comprising the step of releasing of the active structure by etching of a sacrificial layer whereof the material is suitable to be etched selectively relative to the material(s) of the active structure.

The sacrificial layer, for example oxide, is located between two layers forming the active structure, the layer of the active structure, on which the sacrificial layer is deposited, comprising passages revealing another sacrificial layer, the sacrificial layer filling these passages and being in contact with the other sacrificial layer. The portions of the sacrificial layer and of the other sacrificial layer define at least in part the mobile part of the active layer when they are deleted.

In other terms, the space separating the opposite faces is obtained by deposit of a sacrificial layer and the space separating the fixed part and the mobile part in the direction orthogonal to the medium plane of the structure is obtained by etching.

In this way, the mobile part of the mobile structure can be released without the need to protect the material or materials of the active structure by encapsulation.

In addition, vertical releasing is obtained by a simple step of photolithoetching. It is not necessary to previously make "sacrificial" vias. It is possible to have opposite faces whereof the lateral dimensions are minimal, of the order of a micrometer, which limits the surface of the stops and therefore the risks of sticking. This also provides minimal lateral gaps to produce reduced lateral stop distances.

Also, due to the process according to the present invention, the choice of thicknesses of the active part is independent of that of the sacrificial layer.

These opposite faces can form detection electrodes of out-of-plane displacement of the mobile part relative to the fixed part, or actuating electrodes shifting the mobile part relative to the fixed part.

Or, in a MEMS or NEMS system obtained by the process according to the invention, the opposite faces can form stops for limiting out-of-plane movements and limit instances of sticking.

The opposite faces can be narrow to limit the opposite surfaces and thus lower the risks of sticking.

The process according to the invention does not require any encapsulation of element.

Provision can be made to make anti-sticking studs in at least one of the opposite surfaces. For example, the latter are made in the upper opposite surface and intervene both during upwards displacement and during downwards displacement.

In place of using the substrate or the cover, which is necessarily made respectively before or after the active structure, the active structure is shaped so as to place opposite zones with a determined gap between the fixed part and the mobile part, these opposite zones being oriented so as to limit the out-of-plane movements of the mobile part.

Making the stops within the active structure results in considerable control of the value of the gap which is obtained by deposit of a thin layer.

In advantageous manner, in the case of upper and lower stops, the latter can be made at the same time and thus have an identical gap.

It is also possible to make stops which at the same time form out-of-plane stops and in-plane stops, i.e. lateral stops.

The subject-matter of the present invention is mainly a process for producing a micromechanical structure comprising a substrate and a stack of at least one first and a second active layer arranged on the substrate, a mobile part formed in the stack and a fixed part relative to the substrate formed in the stack, the mobile part comprising portions of the at least two layers of the stack and the fixed part comprising portions of the at least two layers of the stack, the fixed part and the mobile part comprising opposite faces substantially parallel to a medium plane of the structure, the process, comprising: from a stack of at least one first sacrificial layer and of the first active layer, the steps of:

a) structuring of the first active layer so as to reveal the first sacrificial layer in at least two zones, b) formation of a second sacrificial layer on the first active layer, the second sacrificial layer covering the zones revealing the first sacrificial layer and passing through the first active layer and being in contact with the first sacrificial layer in the zones, c) structuring of the second sacrificial layer so as to obtain portions of second sacrificial layer on the first active layer at the level of the zones where the second sacrificial layer passes through the first active layer, d) formation of a second active layer on the portions of the second structured sacrificial layer and on the first active layer with which it is directly in contact, the material of the second sacrificial layer able to be etched selectively relative to those of the first and second active layers.

e) structuring of the first and second active layers to attain the portions of the second structured sacrificial layer and the first sacrificial layer, f) elimination of the portions of the second structured sacrificial layer between the opposite faces of the first and second active layers, g) at least partial elimination of the first sacrificial layer releasing the mobile part.

Another subject-matter of the present invention is a process for producing a micromechanical structure comprising a substrate and a stack of a first, a second and a third active layer arranged on the substrate, a mobile part formed in the stack and a fixed part relative to the substrate formed in the stack, the mobile part comprising portions of at least two layers of the stack and the fixed part comprising portions of at least two layers of the stack, the fixed part and the mobile part comprising opposite faces substantially parallel to a medium plane of the structure, the process comprising: from a stack of at least one first sacrificial layer and of the first active layer, the steps of:

a') structuring of the first active layer so as to reveal the first sacrificial layer in at least two zones, b') forming a second sacrificial layer on the first active layer, the second sacrificial layer covering the zones revealing the first sacrificial layer and passing through the first active layer and being in contact with the first sacrificial layer, c') structuring of the second sacrificial layer so as to obtain at least one first and a second portion on the first active layer, at the level of certain zones corresponding to the zones where the two faces are parallel and where the second sacrificial layer passes through the first active layer, d') formation of the second active layer on the first and second portions of the second structured sacrificial layer and on the first active layer, the second active layer being directly in contact with the first active layer, e') structuring of the second active layer at least in certain zones located at the level of the first portion so as to reveal the first portion, f') forming a third sacrificial layer on the second active layer, g') structuring of the third sacrificial layer so as to obtain at least one portion of the third sacrificial layer at least partially covering the zone revealing the first portion of the second sacrificial layer and passing through the second active layer and being in contact with the first portion of the second sacrificial layer, h') formation of the third active layer on the at least one portion of the third structured sacrificial layer and on the second active layer with which it is directly in contact, the materials of the second and third sacrificial layers able to be etched selectively relative to those of the first, second and third active layers, i') structuring of the three active layers to attain the portions of the second and third sacrificial layers and the first sacrificial layer, j') elimination of the portions of the second and third sacrificial layers structured between the opposite faces of the first and second active layers and between the second and third active layers, k') at least partial elimination of the first sacrificial layer releasing the mobile part.

There can be etched portions of first active layer which do not comprise first and/or second sacrificial layer, as they will have been removed during structuring, contrary to the zones defined at a) or a'). These etched portions can for example enable subsequent contact.

For example, during step c'), the first portion of the second sacrificial layer comprises a surface lower than that of the second portion, the first portion having a surface near the section of the portion of second sacrificial layer passing through the first active layer.

In advantageous manner, the material of the second layer and/or of the third sacrificial layer is oxide.

Formation of the second active layer and/or of the third active layer is for example done by epitaxial growth.

The structurings of steps a), c), a'), c'), e'), g') can be obtained by photolithography and etching. The mobile part can be released by means of hydrofluoric acid.

Between steps d) and e), a formation step of at least one implanted zone and between the steps e) and f) can be made, and a formation step of a metallic contact can be made on the at least one implanted zone.

Each of the active layers of the stack can be made of silicon or SiGe. The silicon or the SiGe may be monocrystalline or polycrystalline.

As a variant, the active layers of the stack are made of metallic material, for example gold, copper or FeNi.

In a variant embodiment, the structurings of steps e) and i') are obtained by photolithography and DRIE.

The first sacrificial layer is for example made of silicon oxide, and forms part of a SOI substrate.

Yet another subject-matter of the present invention is a micromechanical structure obtained by the process according to the present invention, comprising a substrate and a stack of at least two layers arranged on the substrate, a mobile part formed in the stack and a fixed part relative to the substrate formed in the stack, the mobile part comprising portions of the at least two layers of the stack and the fixed part comprising portions of the at least two layers of the stack, the fixed part and the mobile part comprising opposite faces substantially parallel to a medium plane of the structure, and material being interposed between the fixed part and the substrate, the material being different to that or those of the layers of the stack forming the fixed and mobile parts, the material able to be etched selectively relative to that or those of the layers of the stack.

For example, the stack comprises a first and a second pair of opposite faces, the medium planes of the two pairs being combined. The stack can comprise a first and a second pair of opposite faces, the face of the first pair belonging to the mobile part being in the same plane as the face of the second pair belonging to the fixed part and the face of the first pair belonging to the fixed part being in the same plane as the face of the second pair belonging to the mobile part.

As a variant, the stack can comprise a first and a second pair of opposite faces, the medium planes of the two pairs being distinct.

In a first embodiment, in normal operation, the mobile part is intended to move in a direction orthogonal to the medium plane of the structure and in which the opposite faces of the fixed and mobile parts form electrodes, the fixed part and the mobile part being at different potentials.

In another embodiment, in normal operation, the mobile part is intended to move in the medium plane of the structure and in which the opposite faces of the fixed and mobile parts form stop means to limit displacement of the mobile part in a direction substantially perpendicular to the stack.

The stack can thus comprise at least one first layer to the side of the substrate and a second layer on the first layer opposite the substrate, and in which the stop means comprise at least one lower stop to limit displacement of the mobile part to the substrate and/or at least one upper stop to limit displacement of the mobile part opposite the substrate, the lower stop being defined in the first layer of the fixed part and in the second layer of the mobile part and the upper stop being defined in the second layer of the fixed part and in the first layer of the mobile part.

The lower stop can comprise a surface in the first layer of the fixed part and a surface in the second layer of the mobile part, the two surfaces being opposite and the upper stop comprises a surface in the second layer of the fixed part and a surface in the first layer of the mobile part, the two surfaces being opposite.

In an embodiment, the stack can comprise at least one first, one second and one third layer, and in which the stop means comprise at least one lower stop to limit displacement of the mobile part to the substrate and/or at least one upper stop to limit displacement of the mobile part opposite the substrate, the lower stop being defined in the first layer of the fixed part and in the second layer of the mobile part and the upper stop being defined in the second layer of the mobile part and in the third layer of the fixed part.

The fixed part can comprise, for example, at least three fingers, and the mobile part can comprise at least three fingers, the fingers of the fixed part and those of the mobile part being interdigitated, in which the upper stop is formed by one of the fingers of the mobile part received between two fingers of the fixed part, the finger comprising two lateral elements each bearing a surface of the upper stop, each lateral element being received in a housing of complementary form formed by the two fingers of the fixed part on either side of the finger of the mobile part, the bottom of these housings forming the opposite surface of the upper stop, and in which the lower stop is formed by one of the fingers of the fixed part received between two fingers of the mobile part, the finger comprising two lateral elements each bearing a surface, each lateral element being received in a housing of complementary form formed by the two fingers of the mobile part on either side of the finger of the fixed part, the bottom of these housings forming the opposite surface.

The fixed part can comprise a face parallel to a face of the mobile part and opposite the face, the faces being substantially orthogonal to the plane of the structure, each face comprising at least one projecting finger, the finger of the mobile part being received in a housing of the fixed part of corresponding form and the finger of the fixed part being received in a housing of the mobile part of corresponding form.

The micromechanical structure can also comprise stops to limit displacement of the mobile part in the plane, called lateral stops.

The housings can also form the lateral stops. By way of advantage, the fingers comprise a free end in the form of a disc received in a housing of corresponding form.

In an embodiment, in the case where the mobile part is intended to move in a direction orthogonal to the medium plane of the structure, it can be ensured that the mobile part comprises at least one mobile mass and two beams on either side of the mobile mass to which the mobile mass is connected by segments, the beam bearing the electrodes, each of the beams cooperating with a sub-part of the fixed part bearing the opposite electrodes.

In another embodiment, in the case where the mobile part is intended to move in a direction orthogonal to the medium plane of the structure, the mobile part can comprise a first and a second electrode arranged side by side and the fixed part comprises a first and a second electrode arranged side by side, each opposite an electrode of the mobile part, the first electrode of the mobile part being made in the first layer and the first electrode of the fixed part being made in the second layer opposite the first electrode of the mobile part, and the second electrode of the mobile part being made in the second layer and the second electrode of the fixed part being made in the first layer opposite the second electrode of the mobile part. The mobile part can have an elongated form whereof a first longitudinal end is mounted on an axis of torsion orthogonal to the axis of the mobile part and whereof a second end bears the electrodes.

The micromechanical structure is for example suitable for creating a detection device of out-of-plane movements or trimming an oscillator.

In another embodiment, in the case where the mobile part is intended to move in a direction orthogonal to the medium plane of the structure, the mobile part comprises a housing formed by a notch of rectangular form made in an edge of the mobile part, the fixed part being received in this notch and having a form corresponding to that of the notch, its lateral edges facing the lateral edges of the mobile part, the electrodes being carried by the lateral edges of the notch and of the mobile electrode, the mobile part being intended to move in a direction substantially orthogonal to the lateral edges.

The electrodes are, for example carried by interdigitated fingers made in the first or the second layer.

Another subject-matter of the present invention is a sensor comprising at least one micromechanical structure according to the present invention. The sensor can be designed to measure out-of-plane displacements of the mobile part. For example, the sensor can form an out-of-plane accelerometer. The sensor can comprise a piezoresistive gauge or a strain gauge.

Another subject-matter of the present invention is an actuator designed to shift the mobile mass along a direction perpendicular to the medium plane.

BRIEF DESCRIPTION OF THE DRAWINGS

The present invention will be more clearly understood with respect to the following description and the attached drawings, in which.

DETAILED DISCLOSURE OF PARTICULAR EMBODIMENTS

Throughout the description, the micromechanical structures described are adapted to making an accelerometer, but it is well understood that the present invention applies to making any other type of sensor, for example making gyrometers and or any other system using such a micromechanical structure.

In the description, MEMS designates both micro-electromechanical systems and nano-electro-mechanical systems.

Figure 1A:
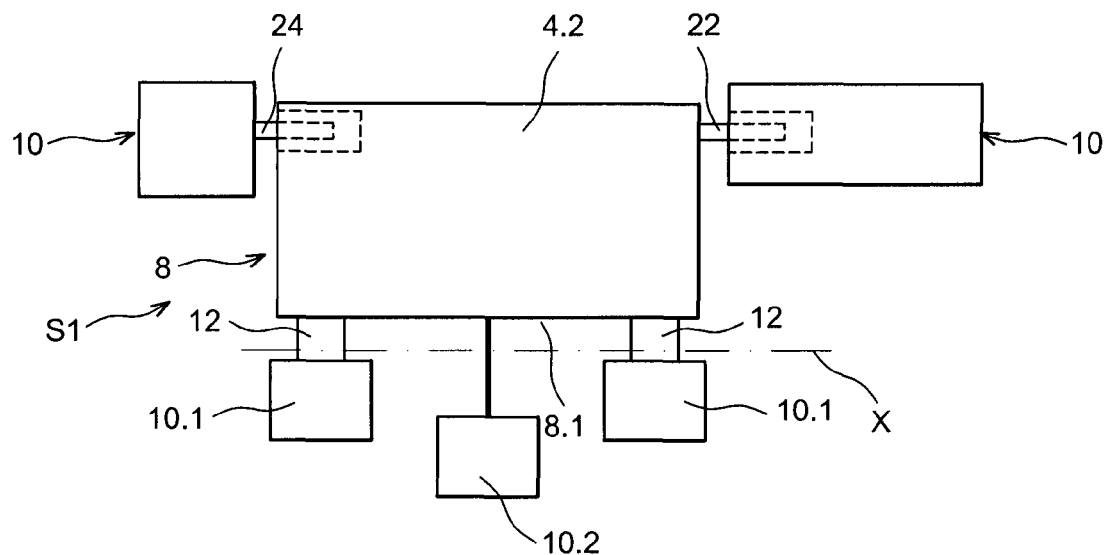
FIG. 1A is a plan view of an example of a micromechanical structure according to the present invention.
Figure 1B:
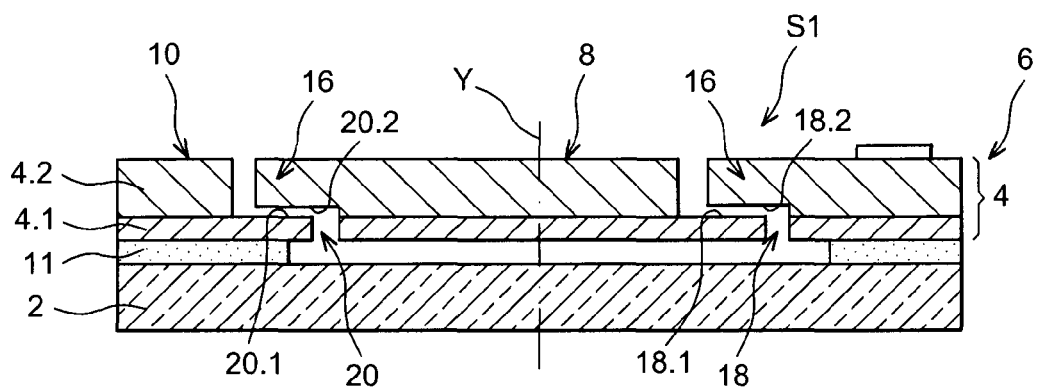
FIG. 1B is a view in transversal section of the structure of FIG. 1A, FIG. 1B' is a view in transversal section of a variant of FIG. 1A.

FIGS. 1A and 1B illustrate a first example of a micro-electro-mechanical structure for making an out-of-plane accelerometer with strain gauge.

A micromechanical structure is called out of plane when the direction of displacement of its mobile part is oriented substantially perpendicularly to its principal plane.

The micromechanical structure S1 of FIGS. 1A and 1B comprises a substrate 2, on which is arranged a stack 4 of at least two layers 4.1, 4.2, in the example shown.

The stack 4 forms the active structure of the micromechanical structure, the active structure 6 comprising a mobile part 8 and a fixed part 10.

The fixed part 10 is fixed relative to the substrate 2. According to the present invention, a sacrificial layer 11 is interposed between the substrate 2 and the stack 4, this layer 11 acting to release the mobile part 8. The sacrificial layer 11 is made of a material which can be etched selectively relative to the materials of the stack forming the active structure, as will be described hereinbelow.

The mobile part 8 is suitable to move out of plane relative to the substrate 2 under the effect of external forces, therefore the movements of the mobile part 8 have to be limited.

In the illustrated example, the mobile part 8 has the form of a rectangle.

The mobile part 8 is kept in overhang at the level of one of its long sides 8.1. In the illustrated example, the overhang is made by means of two elements 12 connecting the long side 8.1 of the mobile part and two studs 10.1 of the fixed part. These two elements also form hinges 12 allowing the mobile part 8 to move out of plane, substantially about an axis X.

In the illustrated example, electric contacts are made at the level of the studs 10.1.

In addition, the micromechanical structure comprises a strain gauge 14 extending between the mobile part 8 and a stud 10.2 of the fixed part 10, by which the displacements of the mobile part 8 are sensed. An electric contact is also created at the level of the stud 10.2.

The micromechanical structure also comprises stop means 16 to limit the extent of displacements of the mobile part 8 according to an axis Y perpendicular to the substrate, more particularly to limit the extent of out-of-plane displacements of the mobile part 8. The stop means 16 are formed between the fixed part 10 and the mobile part 8.

As it can be seen on FIG. 1B, the stop means 16 are formed by structuring of layers of the stack 4 so as to form opposite surfaces perpendicular to the axis Y.

Figure 1B:
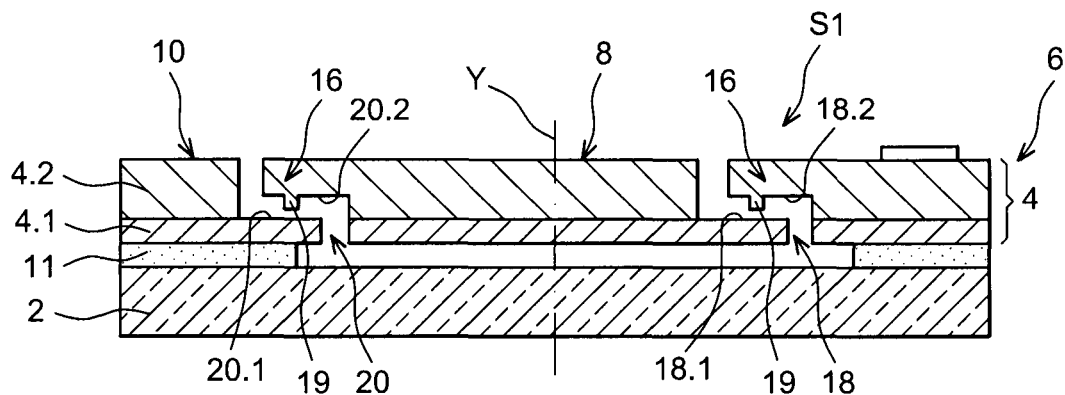

In the illustrated example, the stop means 16 comprise an upper stop 18 to limit displacements of the mobile part moving away from the substrate 2, i.e. to the top in FIG. 1B, and a lower stop 20 to limit displacements of the mobile part moving closer to the substrate 2, i.e. to the bottom in FIG. 1 B.

The stop means can comprise one or more upper stops and/or one or more lower stops.

The upper stop 18 comprises a first surface 18.1 formed in the first layer 4.1 of the stack 4 and oriented away from the substrate, this surface 18.1 being carried by the mobile part 8, and a second surface 18.2 formed in the second layer 4.2 of the stack 4 and oriented in the direction of the substrate 2, this second surface 18.2 being carried by the fixed part 10. The surfaces 18.1 and 18.2 are opposite and the surface 18.1 is intended to come in contact with the surface 18.2 in the event of excessive displacement of the mobile part 8 moving away from the substrate 2.

In the illustrated example and as it is shown on FIG. 1A, the surface 18.1 is formed on an element 22 projecting from a short side 18.2 of the mobile part.

The lower stop 20 comprises a second surface 20.2 formed in the second layer 4.2 of the stack 4 and oriented in the direction of the substrate, this surface 20.1 being carried by the mobile part 8, and a first surface 20.1 formed in the first layer 4.1 of the stack 4 and oriented moving away from the substrate 2, this second surface 20.2 being carried by the fixed part 10. The surfaces 20.1 and 20.2 are opposite and the surface 20.1 is intended to come in contact with the surface 20.2 in the event of excessive displacement of the mobile part 8 to the substrate 2.

In the illustrated example and as is evident in FIG. 1A, the surface 20.2 is formed on an element 24 projecting from a short side of the mobile part, opposite that bearing the element 22 bearing the surface 18.1.

The operation of the micromechanical structure will now be explained.

The mobile part 8 moves about the axis X as a function of the external forces. The mobile part 8 moves closer to and moves away from the substrate 2. Its displacement stresses the suspended strain gauge 14 created in the layer 4.1, the stresses of the strain gauge 14 are collected and enable the preferred magnitudes to be determined.

In case of shock, movement of the mobile part 8 has substantial amplitude in moving away from or moving closer to the substrate 2. The surface 18.1 or 20.1 comes in contact with the surface 18.2 or 20.2 respectively, limiting displacement of the mobile part 8 and avoiding damage to the latter and to the surrounding elements.

FIG. 1B' illustrates a variant of the structure of FIGS. 1A and 1B, comprising anti-sticking studs 19 projecting from surfaces 18.2 and 20.2, intended to limit the risk of sticking between the surfaces 18.1, 18.2 and 20.1, 20.2.

A production process of a MEMS system fitted with out-of-plane stop means will now be described.

A SOI structure (silicon on insulator) is used, for example, that comprises a substrate 602 and a layer of Buried Oxide BOX, forming the sacrificial layer 604 and a layer of silicon 606 forming one of the layers of the active stack. The sacrificial layer 604 has a thickness of the order of 1 μm and the layer of silicon 606 has a thickness of the order of 0.2 μm.

Figure 7A:
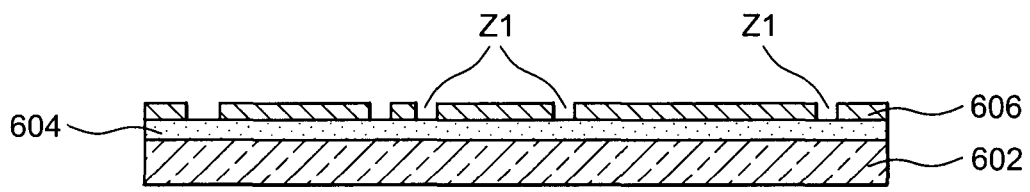
FIGS. 7A to 7G are schematic illustrations of steps of an example of a production process of a micromechanical structure.

During a first step illustrated in FIG. 7A, the layer 606 is structured, for example by photolithography and etching. On completion of this step, pickling is carried out to eliminate the resin mask, resulting in zones Z1 revealing the sacrificial layer.

Figure 7B:
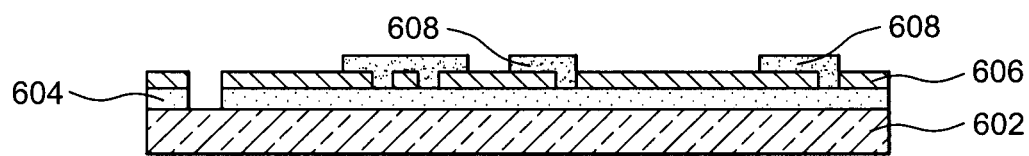

During a following step illustrated in FIG. 7B, a layer of oxide 608 is deposited on the layer of silicon 606, of a thickness of the order of 0.3 μm. The layer of oxide 608 fills the zones Z1 and makes contact with the sacrificial layer 604.

Next, structuring of the layer 608 is carried out by photolithography and etching. On completion of this step, pickling is carried out to eliminate etching residue. Completion of this step results in at least two portions of layer of oxide passing through the first layer 606 and covering the latter partially and the zones where the layer 606 is uncovered. In the illustrated example, the structure comprises three portions.

Figure 7C:
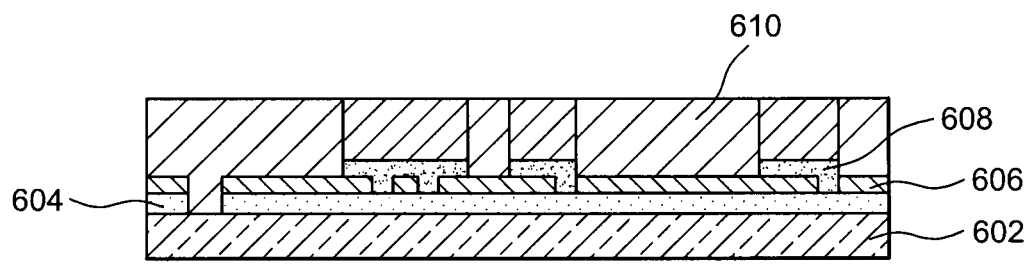

During a following step illustrated in FIG. 7C, a deposit of a layer of doped silicon 610 forming the second layer of the active stack is formed. The layer 610 is obtained for example, by epitaxial growth, and has a thickness of the order of 10 μm. Using at least two active layers results in the layer of structured oxide 608 being buried between the first active layer 606 and the second active layer 610.

The silicon, in this case, deposited by epitaxial growth on the structured parts of the layer of oxide 608 is polycrystalline, whereas that deposited on the active layer 606 is monocrystalline. The deposit conditions could be such that the layer 606 of silicon would be entirely polycrystallinised.

On completion of this step, mechano-chemical polishing can be performed to plane the step due to the sacrificial layer.

As a variant, lithography and partial etching of portions 608 can be carried out prior to deposit of the layer 610 to make anti-sticking studs such as illustrated in FIG. 1B.

Figure 7D:
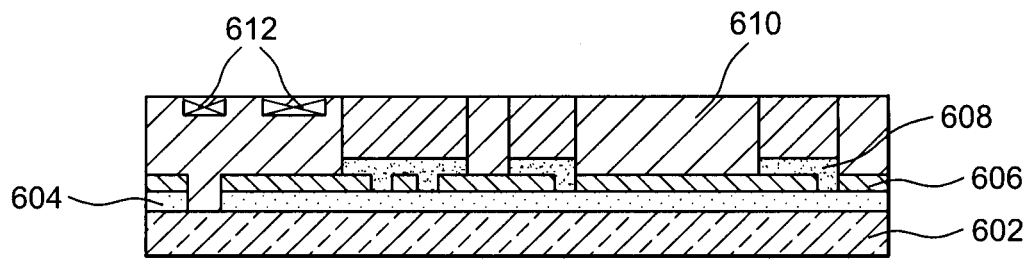

During an advantageous following step illustrated in FIG. 7D, implanted zones 612 are generated to make the electrical contacts.

The implanted zones decrease contact resistance in the case where the silicon obtained by epitaxial growth is lightly doped.

For this to happen, the zones to be implanted by photolithography are created, followed by pickling. Next, implantation of the relevant zones is completed, followed by annealing to activate the implanted zones 612.

Figure 7E:
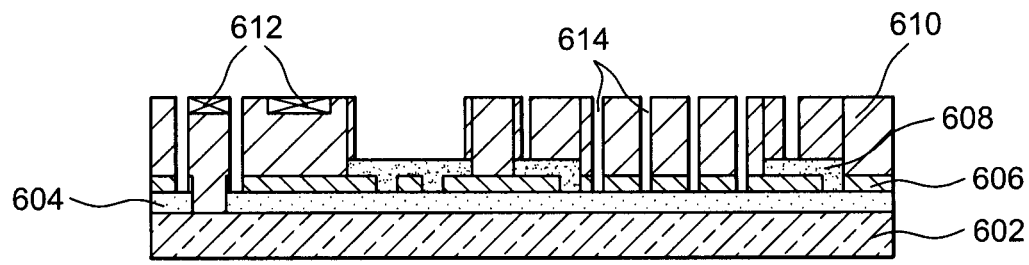

During a following step illustrated in FIG. 7E, the micromechanical structure is made. For example, the zones to be etched by photolithography are delimited, then vertical etching 614 is carried out in the thickness of the two active layers 606, 610 down to the layer of oxide 608 and the sacrificial layer 604, for example by DRIE (Deep Reactive Ion Etching) or deep etching of the silicon.

Figure 7F:
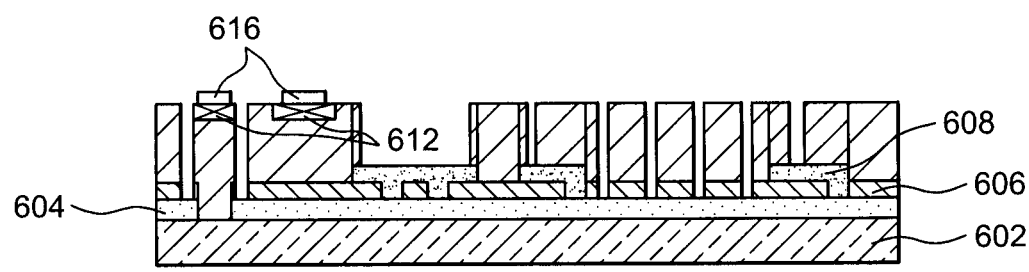

During a following step illustrated in FIG. 7F, the electrical contacts 616 above the implanted zones 612 are made. For this, deposit of a metallic layer is made, and the zones to be deleted and retained by photolithography are distinguished. Next the metallic layer is etched to retain only the contacts 614.

On completion of this step, pickling is completed to remove the resin mask.

Figure 7G:
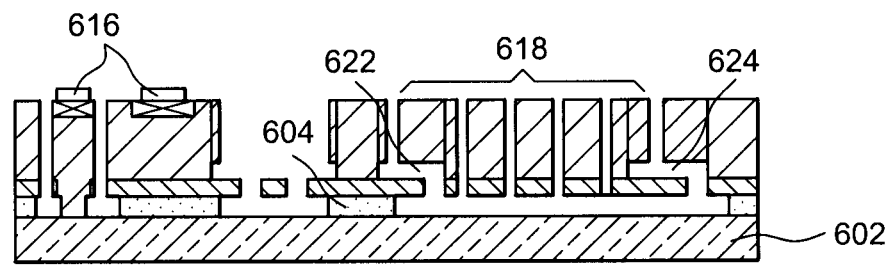

Finally, during a final step illustrated in FIG. 7G, the mobile part 618 is released by removal of the sacrificial layer 604 and the oxide, for example by means of liquid and/or vapour hydrofluoric acid (HF). This is time etching. The hydrofluoric acid is left in contact with the sacrificial layer and the oxide for long enough to release the mobile part while leaving the sacrificial layer beneath the fixed part.

Removing the portions of layers of oxide horizontally releases the mobile part from the active structure.

Therefore, a micromechanical structure in which the lower 622 and upper 624 stops are made within the active structure can be produces in a simplified manner. This process needs no encapsulating of materials of the active structure to prevent their etching by the hydrofluoric acid. In addition, vertical etchings are obtained easily by photolithoetching and not by making vias.

In the case of using a SOI substrate, the second layer and the following, if needed, can be made by depositing silicon or polycrystalline SiGe.

A standard substrate can also be used, by depositing a sacrificial layer of oxide for example, and by depositing a first layer of polycrystalline Si or polycrystalline SiGe. The second active layer is completed, and the following ones, if needed, also in polycrystalline silicon or polycrystalline SiGe.

Layers of metallic materials such as gold, copper, FeNi, etc. can also be used to make the active layers.

Figure 2:
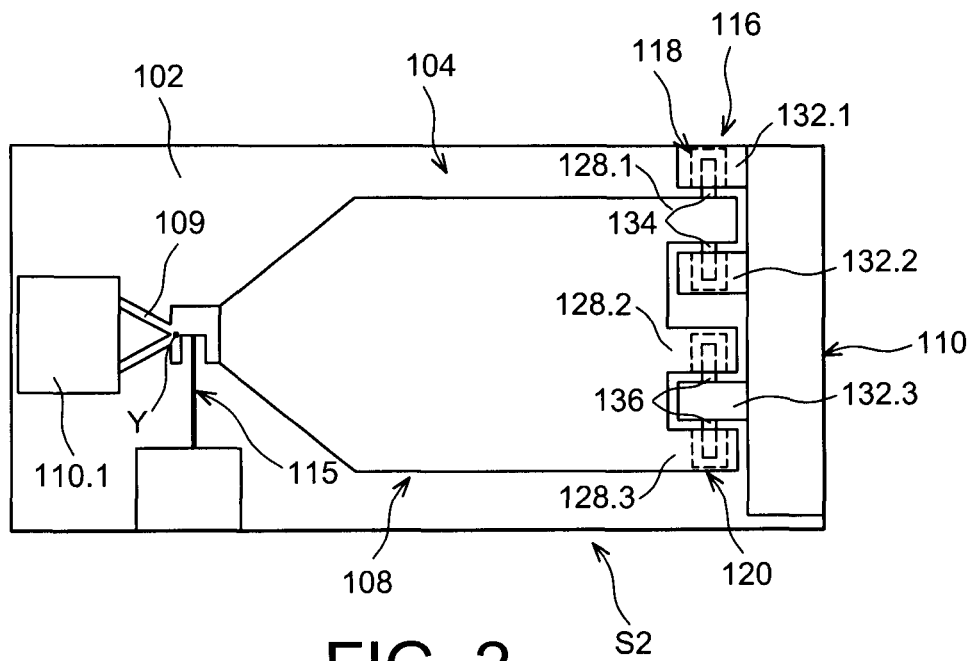
FIG. 2 is a plan view of another embodiment of a micromechanical structure.

FIG. 2 illustrates a second example of a micromechanical structure S2 forming an accelerometer whereof the mobile part is designed in normal operation to move in the plane.

The micromechanical structure comprises a substrate 102, a stack 104 of at least two layers forming the active structure of the micromechanical structure. The stack 104 is structured so as to comprise a fixed part 110 and a mobile part 108.

In this example, the mobile part 108 has substantially the form of a pentagon composed of a rectangle and an isosceles triangle, a short side of the rectangle and the base of the triangle being common.

The mobile part 108 is suspended by beams 109 at the level of an apex of the isosceles triangle on a stud 110.1 of the fixed part 110.

The mobile part 108 is suitable to pivot about an axis Y perpendicular to the plane of the sheet.

The micromechanical structure also comprises a suspended piezoresistive gauge 115 to sense displacements of the mobile part 108.

The micromechanical structure also comprises stop means 116 arranged opposite the axis of rotation Y relative to the mobile part 108.

In the illustrated example, the stop means 116 comprise upper 118 and lower 120 stops. The stops 118 and 120 comprise opposite surfaces carried by the mobile part 108 and by the fixed part 110 of the stack 104.

A part of the stop means 116 is made on a short side of the rectangle.

The mobile part 108 comprises three fingers 128.1, 128.2, 128.3 projecting from the short side.

The fixed part comprises a bar 130 parallel to the short side and also three fingers 132.1, 132.2, 132.3.

The finger 128.1 is arranged with play between the two fingers 132.1 and 132.2, and the finger 132.3 is arranged with play between the fingers 128.2 and 128.3.

The fingers 128.1, 128.2, 128.3, 132.1, 132.2, 132.3 are made in the second layer of the stack 104.

The finger 128.1 comprises two elements 134 projecting from its lateral edges formed in the first layer 104.1 of the stack 104.

Each one of the two elements 134 is placed under a finger 132.1, 132.2, as shown in dotted lines. The fingers 132.1, 132.2 and the elements 134 bear opposite surfaces, forming an upper stop.

The finger 132.3 of the fixed part 110 comprises two elements 136 projecting from its lateral edges formed in the first layer of the stack 104.

Each one of the two elements 136 is placed under a finger 128.2, 128.3, as shown in dotted lines. The fingers 128.2, 128.3 and the elements 136 bear opposite surfaces, forming a lower stop.

The stops operate similarly to that of the example of FIGS. 1A and 1B.

Figure 3:
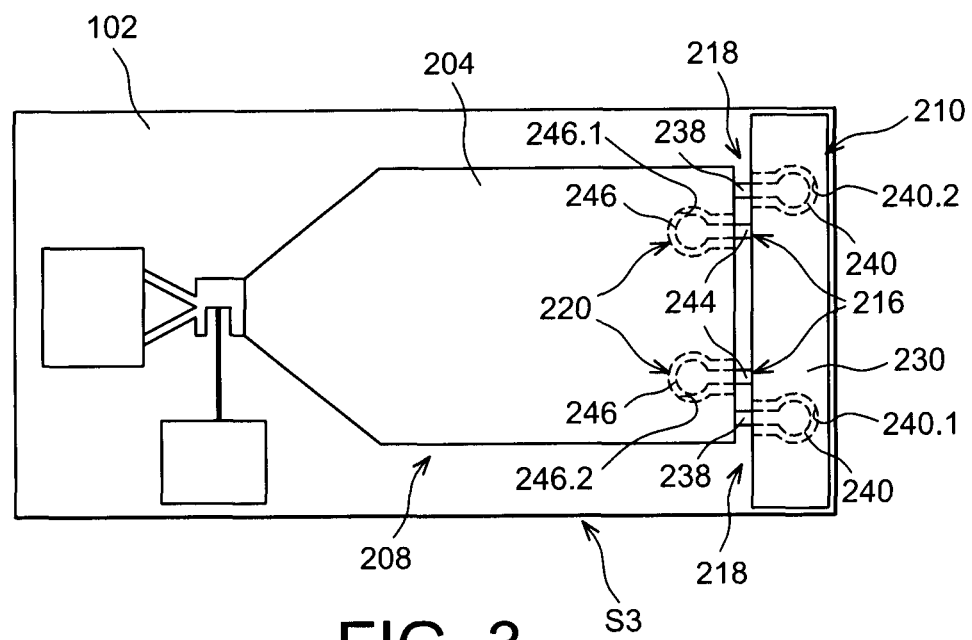
FIG. 3 is a plan view of another embodiment of a micromechanical structure comprising lateral stops.

FIG. 3 shows another embodiment of a micromechanical structure S3.

The micromechanical structure S3 is very close to that of the structure S2 of FIG. 2. It comprises a substrate 202, a stack 204 of at least two layers forming the active structure of the micromechanical structure. The stack is structured so as to comprise a fixed part 210 and a mobile part 208.

The micromechanical structure S3 differs from the structure S2 by its stop means 216 which form both upper 218 and lower 220 stops and lateral stops.

The upper stop comprises two fingers 238 projecting from the short side of the rectangle formed in the first layer 204 of the stack, these fingers being substantially orthogonal to the short side of the rectangle. These two fingers are, in the illustrated example, arranged at the two ends of the short side.

The bar 230 of the fixed part comprises two housings 240 made in the first layer 204.1 of the stack and each taking up one finger 238 of the mobile part 208. The housings 240 have a form complementary to that of the fingers 238. The housing 240 comprises an upper base formed in the second layer 204 of the stack 204 and a lateral wall 240.1 formed in the first layer of the stack 204.

In the illustrated example, the fingers 238 comprise an end in the form of a disc attached to the short side by a beam, the width of the beam being less than the diameter of the disc. The housings 240 therefore have a form complementary to that of the ends of the fingers 238. The circular stops ensure stop in translation in both directions. In considering the structure in its horizontal position, the circular stops form a stop to the left and to the right and to the front and to the rear. In addition, contact between the fingers and the housings in which the fingers are received is specific, limiting the risk of sticking.

The lower stop 220 also comprises two fingers 244 projecting from the bar 230, formed in the first layer of the stack 204, these fingers 244 being substantially orthogonal to the axis of the bar 230. These two fingers 244 are, in the illustrated example, between the two housings 240.

The fixed part comprises two housings 246 made in the first layer of the stack 204 and each taking up a finger 244 of the fixed part. The housings 246 have a form complementary to that of the fingers 244. The housings 246 comprise a lower base formed in the second layer of the stack 204 and a lateral wall 246.1 formed in the first layer of the stack 204.

In the illustrated example, the fingers 244 comprise an end in the form of a disc attached to the bar 230 by a beam, the width of the beam being lower than the diameter of the disc. The housings 246 therefore have a complementary form.

It is well understood that neither the number of fingers of the stops nor their placement is limiting. In addition, the lower stop can comprise more or fewer fingers than the upper stop.

The functioning of the stops will now be explained.

For example, when a shock causes excessive upwards displacement of the mobile part, the fingers 238, more particularly the discs and part of the beams, make contact with the upper base of the housings 240.

When a shock causes excessive downwards displacement of the mobile part, the fingers 244, more particularly the discs and part of the beams, make contact with the lower base of the housings 246.

When a shock causes excessive displacement of the mobile part laterally (from top to bottom or from right in the illustration in FIG. 3), at least one of the fingers 238, 244 makes contact with the lateral wall 240.1, 246.1 of its housing, therefore limiting lateral displacement.

Figure 4:
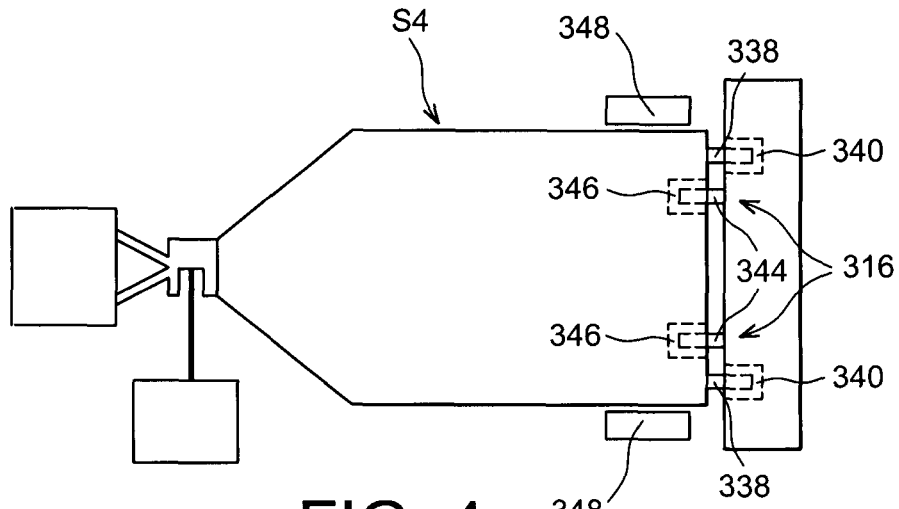
FIG. 4 is a plan view of another embodiment of a micromechanical structure comprising a variant in lateral stops.

FIG. 4 shows a variant embodiment S4 of the micromechanical structure S3 of FIG. 3. In this micromechanical structure S4, the lateral stops are distinct from the upper and lower stops.

The stop means 316 of the micromechanical structure S4 comprise fingers 338, 344 of rectangular form received in housings 340, 346 of corresponding form respectively.

In addition, the micromechanical structure S4 comprises lateral stops 348 formed in the fixed parts and arranged opposite the long sides of the rectangle. When a shock causes excessive displacement of the mobile part laterally, one of the long sides as a function of the orientation of displacement makes contact with one of the lateral stops 348, thus limiting lateral displacement.

This realisation simplifies making the stop means 316.

Figure 5:
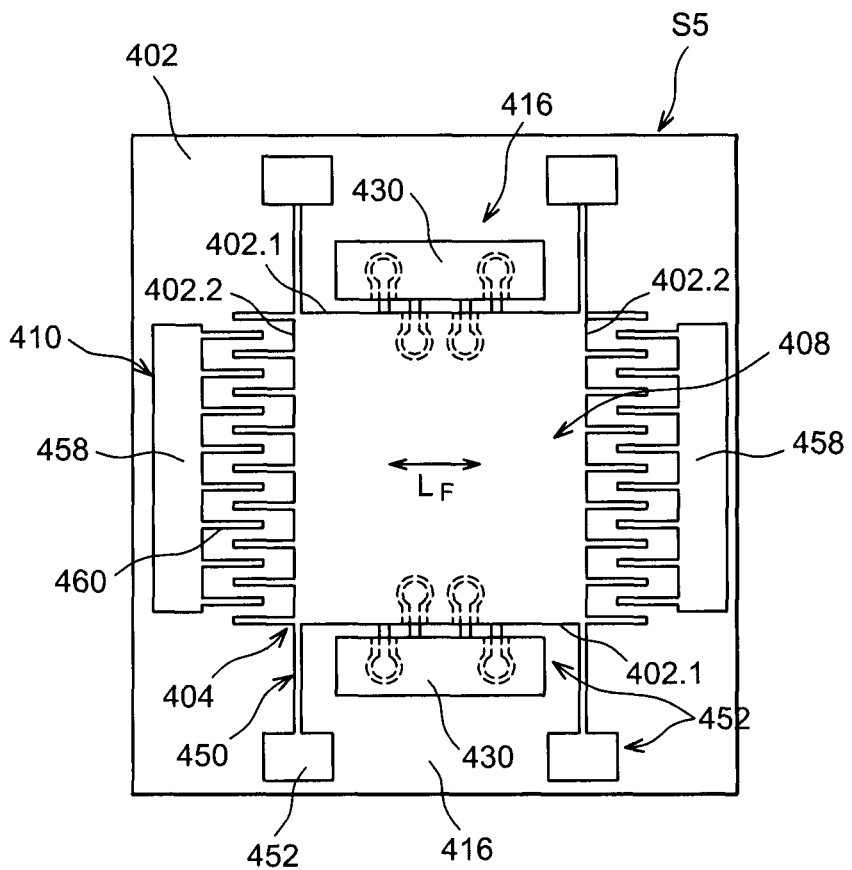
FIG. 5 is a plan view of another embodiment of a micromechanical structure.

FIG. 5 shows another example of a micromechanical structure S5 intended for making an accelerometer of interdigitated combs type.

The structure S5 comprises a substrate 402, a stack 404 of at least two layers forming the active structure of the micromechanical structure. The stack is structured so as to comprise a fixed part 410 and a mobile part 408.

The mobile part 408 has the form of a rectangle fitted with two long sides 408.1 and two short sides 408.2.

The mobile part is suspended above the substrate by four springs subjected to bending stress 450 located at the four corners of the mobile part 408 and attaching to four studs 452 of the fixed part. The mobile part 408 also comprises teeth 454 projecting from its long sides.

The fixed part 410 comprises two bars 458 arranged on either side of the mobile part 408 and parallel to the long sides 402.2. The bars 458 also comprise projecting teeth 460.

The teeth 454 and 460 are interdigitated and have opposite parallel faces.

Displacement of the mobile part 408, in normal operation, is symbolised by arrow F.

The micromechanical structure S5 also comprises stop means 416 which are of form similar to those of the micromechanical structure S3 of FIG. 3. However the stop means 416 are located on the two short sides 402.1 of the mobile part 408. In fact, contrary to the micromechanical structure S3, out-of-plane displacements of the mobile part 408 are not limited to one end by an axis of rotation; the springs subjected to bending stress are not suitable for adequately limiting such displacements.

The fixed part 410 comprises two bars 430 each opposite a short side. The mobile part 408 comprises fingers 238 received in housings 440 of the fixed part 410, and the fixed part comprises fingers 244 received in housings 446 of the mobile part 408. The stop means 416 at the same time form stops upper, lower and lateral.

The functioning is similar to that of the micromechanical structure S3.

Figure 6:
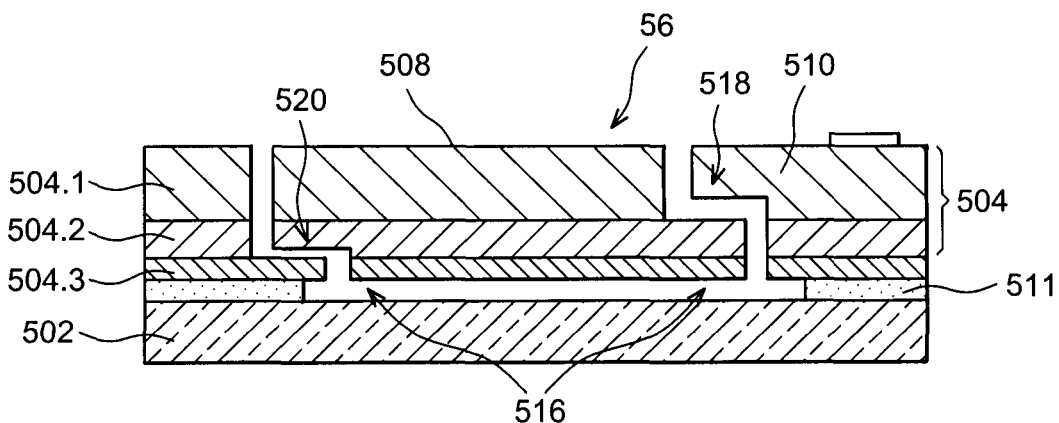
FIG. 6 is a view in, transversal section of a micromechanical structure comprising an active structure composed of three layers.

FIG. 6 shows a variant S6 of the micromechanical structure S1 of FIGS. 1A and 1B. The micromechanical structure S6 differs from the micromechanical structure S1 by the fact that the stack comprises three layers.

The present invention is not limited to using a stack of two layers to make the stop means. The stack can comprise n layers, n being equal to or greater than 2. In addition, the layers can be of a different thickness and of a different material.

Using a stack of at least three layers makes stops at different levels of the active layer and/or with a different gap value.

The micromechanical structure S6 comprises a substrate 502, a stack 504 of three layers 504.1, 504.2, 504.3 forming the active structure of the micromechanical structure and stop means 516. The stack is structured so as to comprise a mobile part 508 and a fixed part 510.

According to the present invention, a sacrificial layer 511 is interposed between the substrate 502 and the layer 504.1, whereof the material can be etched selectively relative to the materials of the active structure.

In this embodiment, the layers 504.1, 504.2, 504.3 are of different thickness, the layer 504.1 having the least thickness and the layer 504.3 having the greatest thickness.

In the illustrated example, the upper stop 518 comprises a face of the mobile part 508 formed by the second layer 504.2 and a face of the fixed part 510 formed in the third layer 504.3.

The lower stop 520 comprises a face of the mobile part 508 formed in the second layer 504.2 and a face of the fixed part 510 formed by the first layer 504.3.

This provides very good control of the height of the gap of the vertical stops, since the height is defined by the thickness of the thin layers.

An example of a production process of a MEMS system will now be described, in which the active part comprises three layers and whereof the steps are sketched in FIGS. 8A to 8I.

A SOI structure (silicon on insulator) comprising a substrate 702 and a layer of oxide (BOX: Buried oxide) are used, for example, forming the sacrificial layer 704 and a layer of silicon 706 forming one of the layers of the active stack. The sacrificial layer 704 has a thickness of the order of 1 µm and the layer of silicon 706 has a thickness of the order of 0.2 µm.

Figure 8A:
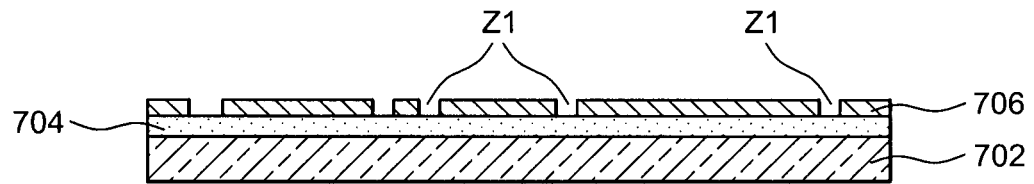
FIGS. 8A to 8I are schematic illustrations of steps of an example of a production process of a micromechanical structure whereof the active part comprises three layers.

During a first step illustrated in FIG. 8A, the layer 706 is structured, for example by photolithography and etching. On completion of this step, pickling is carried out to delete the resin mask, producing zones Z1 revealing the sacrificial layer 704.

Figure 8B:
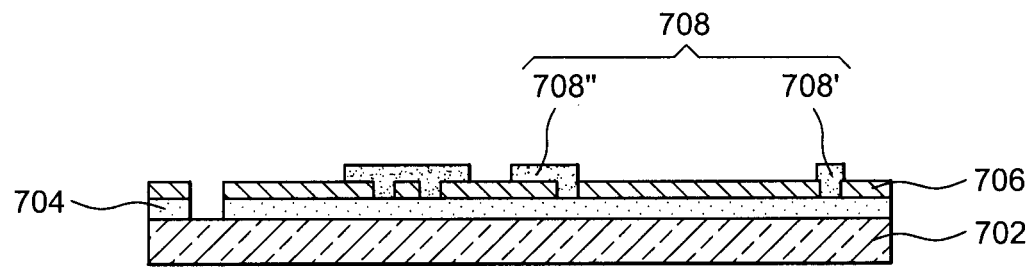

During a following step illustrated in FIG. 8B, a layer of oxide 708 is deposited on the layer of silicon 706, having a thickness of the order of 0.3 µm. The layer of oxide 708 fills the zones Z1 and makes contact with the sacrificial layer 704.

Structuring of the layer 708 is next carried out by photolithography and etching. On completion of this step, pickling can be done to delete the etching mask. Completion of this step produces at least two of the portions of a layer of oxide passing through the first layer 706 and covering it partially and the zones where the layer 706 is uncovered. In the illustrated example, there are three portions of oxide.

In the illustrated example, one of the portions 708' has a horizontal dimension substantially equal to that of the zone Z1 it is covering. The other portion 708" will enable formation of the lower stop. However, it may eventuate that all portions of oxide have the same dimensions.

By way of a variant, lithography and partial etching of the portion 708' can be completed prior to depositing of the layer 710 to make anti-sticking studs.

Figure 8C:
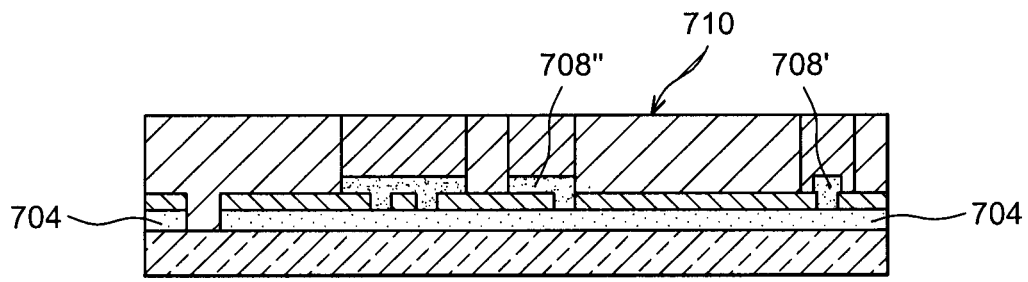

During a following step illustrated in FIG. 8C, a deposit of a layer of doped silicon 710 is formed, forming the second layer of the active stack.

The layer 710 is obtained for example, by epitaxial growth, and has a thickness of 5 µm for example.

The silicon deposited by epitaxial growth on the structured parts of the layer of oxide 708 is polycrystalline, whereas that deposited on the active layer 706 is monocrystalline.

On completion of this step, mechano-chemical polishing can be carried out to plane the step due to the sacrificial layer and to the different growth rates between the silicon monocrystalline and the polycrystalline silicon.

Figure 8D:
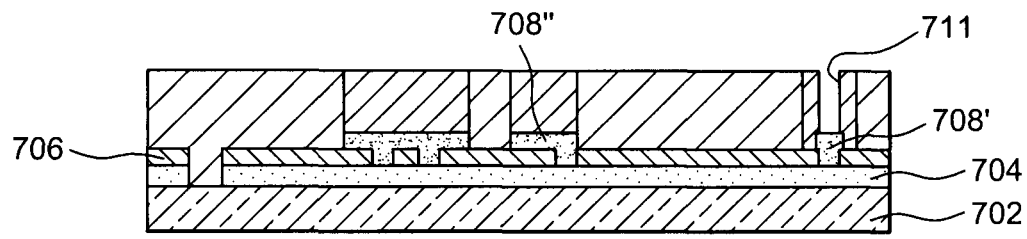
Figure 8E:
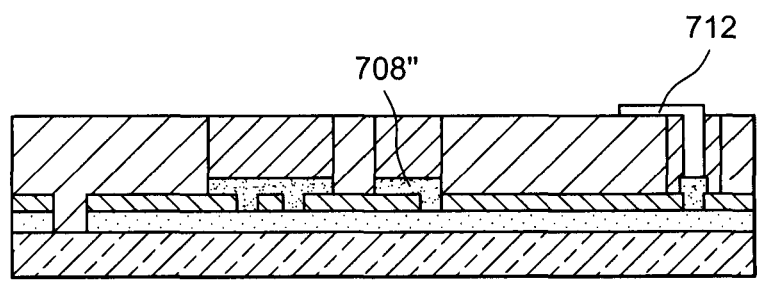

During a following step illustrated in FIG. 8D, photolithography of the zone of the active layer 710 is completed at the level of the portion 708', then this zone is etched to reach the portion of oxide 708', thus forming a vertical channel 711 in the active layer 710.

Next, deposit of a new layer of oxide 712 and structuring thereof are carried out. The channel 711 is filled with oxide. On completion of etching, a portion remains above the portion 708' and connected to the portion 708', which will enable formation of the upper stop. It is also possible to complete lithography and partial etching of this portion prior to deposit of the layer 715, which will be described hereinbelow, to make anti-sticking studs.

The oxide of this second layer can be identical or different to that of the first layer.

Figure 8F:
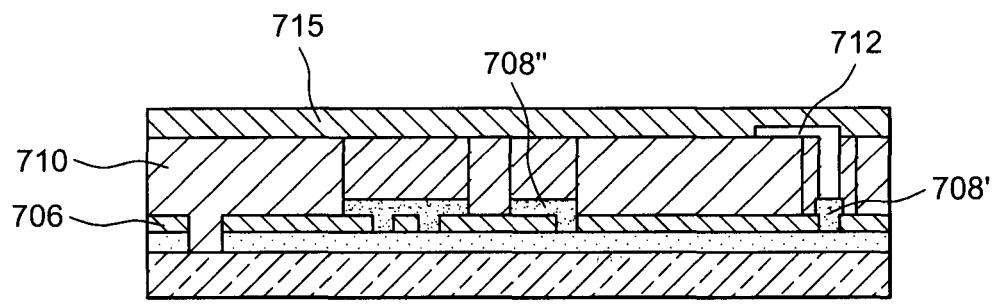

During a following step illustrated in FIG. 8F, deposit 715 of silicon is done, for example by epitaxial growth, forming the third active layer. The thickness of the layer 715 is for example around 3 µm.

Figure 8G:
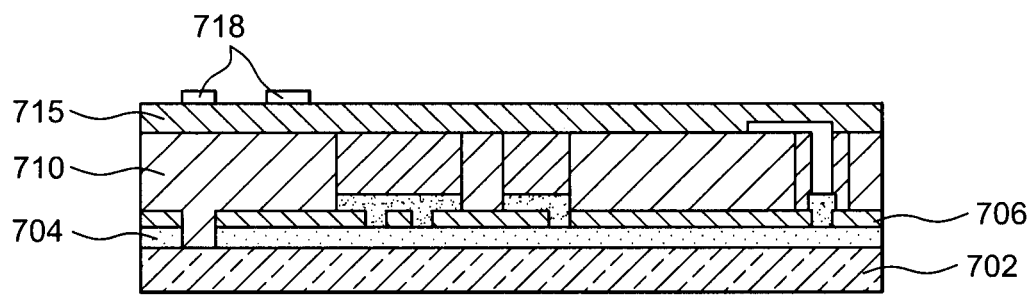

During a following step illustrated in FIG. 8G, deposit of a metallic layer 718 is done. Photolithography is used to delimit the electrical contacts, followed by etching to form these contacts. Implanted zones could also be made.

Figure 8H:
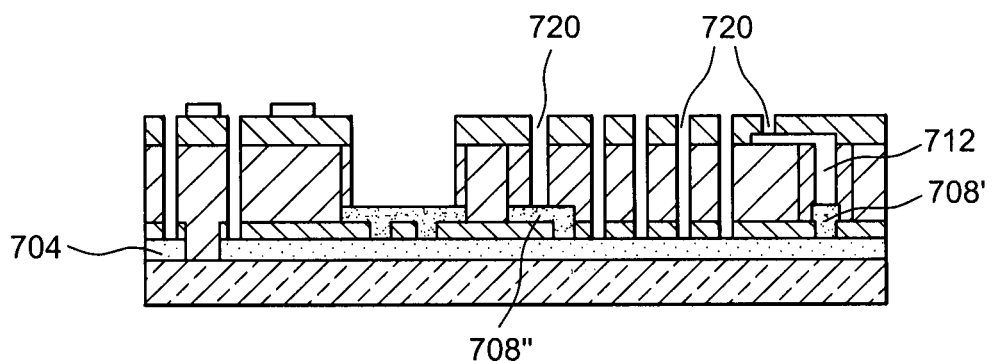

During a following step illustrated in FIG. 8H, the micromechanical structure is made. For example, the zones to be etched by photolithography are made, then vertical etchings 720 are made in the thickness of the three active layers 706, 710, 715 as far as the portions of oxide 708', 708" and 712 and as far as the sacrificial layer 704, for example by DRIE (Deep Reactive Ion Etching) or deep etching of the silicon.

Figure 8I:
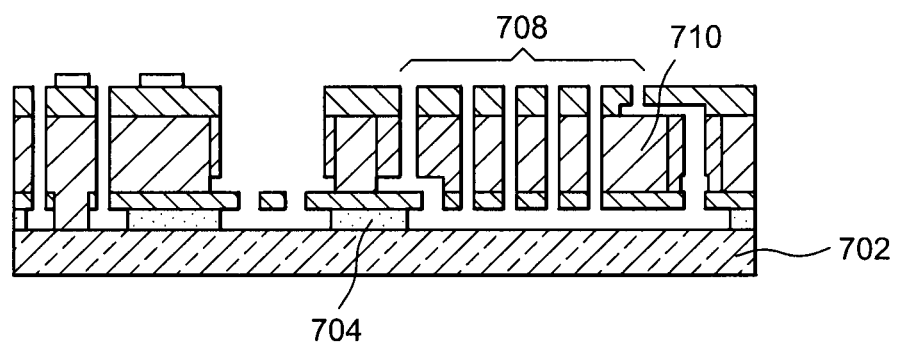

Finally, during a final step illustrated in FIG. 8I, the mobile part 708 is released by removal of the sacrificial layer 704 and the portions of oxide, for example by means of liquid and/or vapour hydrofluoric acid. This is time etching. The hydrofluoric acid is left in contact with the sacrificial layer and the oxide for long enough to release the mobile part while leaving the sacrificial layer under the fixed part.

Removing the portions of layers of oxide 708" and 712 releases the upper and lower stops.

A micromechanical structure in which the lower and upper stops are made within the active structure in two different planes can be produced in a simplified manner.

As in the case of a structure with two layers, in the case of using a SOI substrate the second layer and the following layer, if needed, can be made by deposit of silicon or polycrystalline SiGe.

A standard substrate can also be used, by depositing of a sacrificial layer of oxide for example, and by depositing a first layer of polycrystalline silicon or polycrystalline SiGe. The second active layer is made, and the following one, if needed, also made of polycrystalline silicon or polycrystalline SiGe.

Layers of metallic materials such as gold, copper, FeNi, etc. can also be used to make the active layers.

It is well understood that all methods for structuring different layers are applicable.

In addition, stops having a symmetrical or dissymmetrical gap in both vertical displacement directions can be made, since the stops are produced in two steps.

Finally, it is possible to combine vertical stops and lateral stops and to obtain stops along three axes of space by using surface technology requiring no wafer transfer.

The micromechanical structures according to the present invention can especially be used in MEMS or NEMS microsensors, inertial sensors (accelerometer, gyrometer), MEMS or NEMS magnetometers with piezoresistive or capacitive detection, MEMS micro-actuators (optical scanner, etc.), in systems for converting mechanical energy into electrical energy.

The present invention applies also to making MEMS and NEMS sensors and actuators using horizontal capacitive detection electrodes for detection of vertical movements and/or actuating means generated by a vertical force.

For example, such MEMS or NEMS systems can be used to make inertial sensors, such as accelerometers according to the direction Z with capacitive or other detection and/or using feedback of the detection movement according to Z, or X/Y gyroscopes with capacitive or other detection, and able to use feedback of detection movement according to Z. Horizontal electrodes made according to the processes described can also serve to excite and/or adjust the electrostatic resonance frequency (trimming) of the out-of-plane movement resonator, or compensation electrodes of quadrature bias in the case of gyrometers.

Such MEMS or NEMS systems can also be used to make actuators using movement out of plane.

Figure 9:
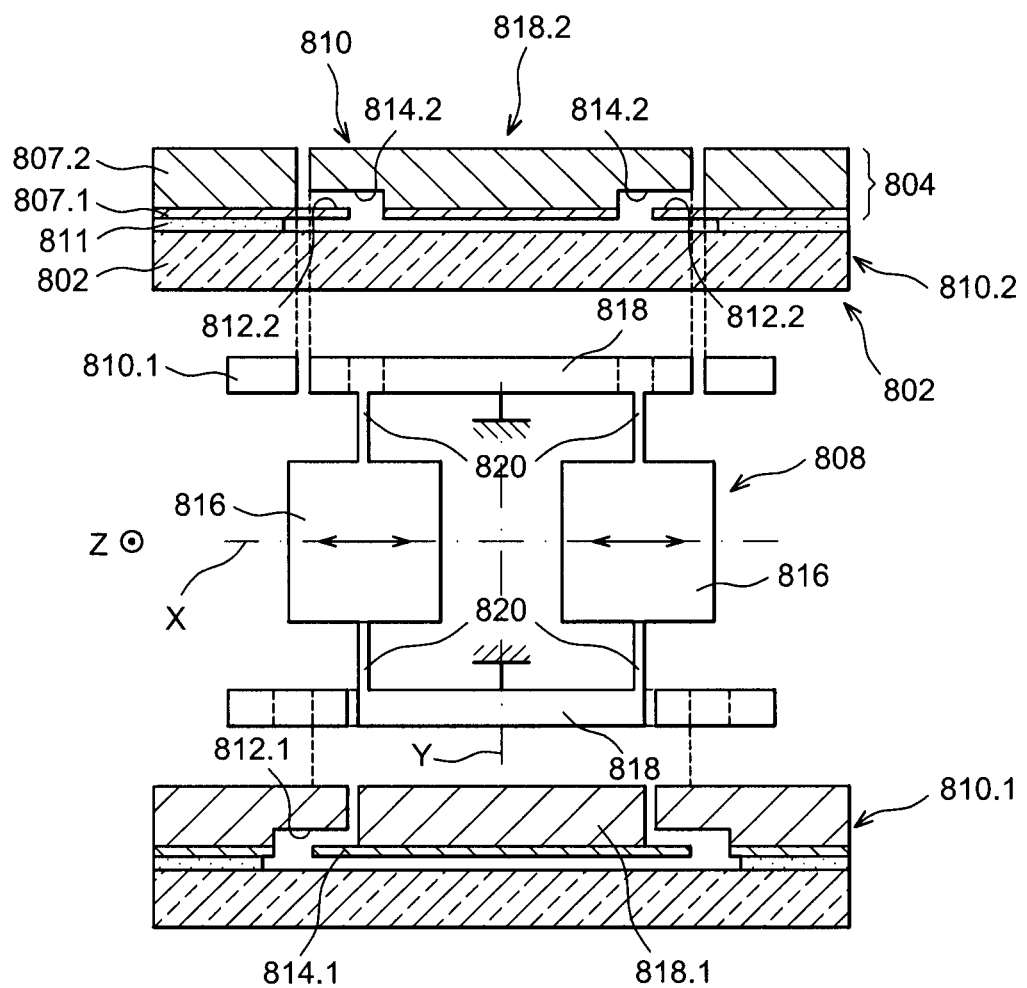
FIG. 9 is a plan view and side elevation of a structure adapted to making a gyrometer.

FIG. 9 shows an embodiment of a micromechanical structure able to be utilised in a gyroscope Y. In FIG. 9, the excitation combs and compensation electrodes of quadrature bias are not illustrated.

The gyroscope comprises an active structure 804 deposited on a substrate 802. According to the present invention, the active part is formed by a stack of at least two layers 807.1, 807.2 resting on a sacrificial layer 811 whereof the material can be etched selectively relative to the material(s) of the stack.

The active structure comprises a mobile part 808 and a fixed part 810, each comprising opposite daces respectively, these opposite faces forming detection electrodes, of counter-reaction, trimming, etc.

Rotation of the mobile part is detected along the axis Z perpendicular to the plane of the sheet.

In the illustrated example, the mobile part comprises two mobile masses 816 arranged side by side symmetrically relative to the axis Y, and two beams 818.1, 818.2 arranged parallel on either side of the two mobile masses. Each mobile mass is connected to the two beams by a connecting segment 820. The mobile part 808 is symmetrical relative to the axis Y. In the illustrated example, the connecting segments 820 are perpendicular to the axis of the beams and to the faces of the mobile masses to which they are attached.

The fixed part 810 is also in two sub-parts 810.1, 810.2, each cooperating with the two beams 818 of the mobile part.

The fixed sub-part 810.1 comprises electrodes 812.1 formed in the second layer, and the beam 818.1 comprises electrodes 814.1 formed in the first layer, the beam 818.2 having the form of a reversed T and the fixed sub-part 810.1 comprising a housing of corresponding form.

The fixed sub-part 810.2 comprises electrodes 812.1 formed in the first layer, and the beam 818.1 comprises electrodes 814.2 formed in the second layer, the beam 818.2 having the form of a T at the site whereof the branches are opposite the first layer of the stack.

A sacrificial layer 811 is used whereof the material can be etched selectively relative to the material(s) of the stack, which simplifies the production process.

This structure is also applicable to an actuator.

Figure 10:
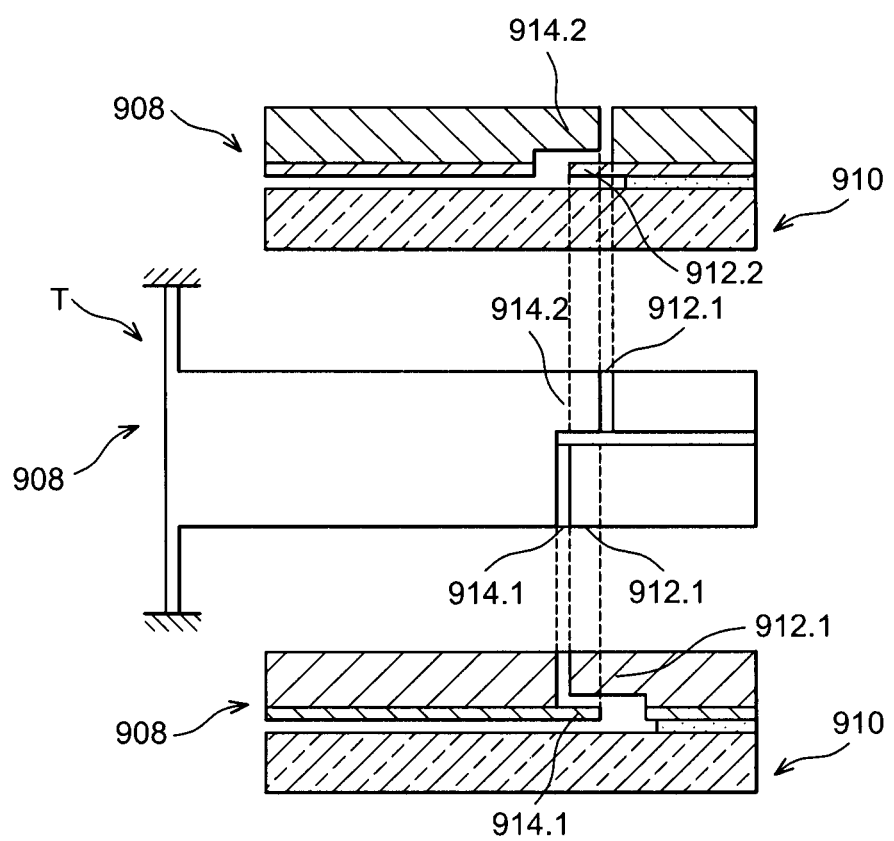
FIG. 10 is a plan view and side elevation of a structure adapted to the making a vertical accelerometer.

FIG. 10 shows an embodiment of a system particularly applicable to trimming, counter-reaction or differential detection of an oscillator or detection of out-of-plane movement.

This system comprises a mobile part 908 substantially rectangular in shape, suitable to move about an axis of torsion T orthogonal to its longitudinal direction, located at a first longitudinal end.

At the level of a second end opposite to that bearing the axis of torsion T, the mobile part comprises at the same time an electrode 914.1 formed in the first layer of the stack and an electrode 914.2 formed in the second layer of the stack, the two electrodes 914.1, 914.2 being side by side. Inversely, the fixed part 910 comprises an electrode 912.1 formed in the second layer of the stack opposite the electrode 914.1 in the first layer of the mobile part 908 and a second electrode 912.2 in the second layer of the stack opposite the electrode 914.2 formed in the first layer of the stack of the mobile electrode 908.

This system is particularly well adapted for making a vertical accelerometer.

Figure 11A:
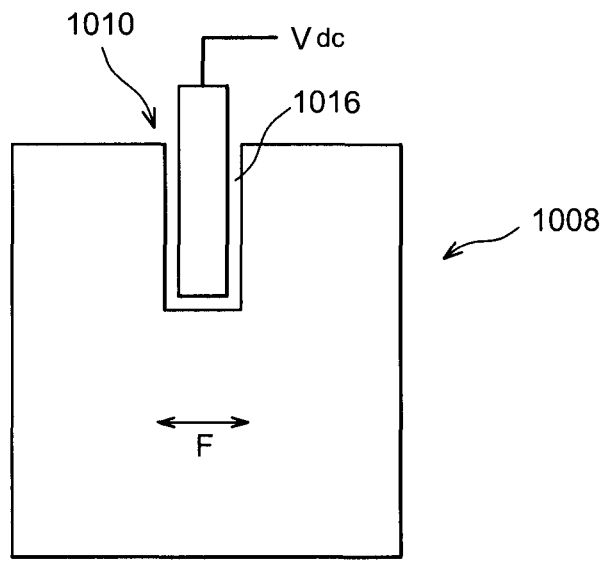
FIGS. 11A and 11B are plan views and side elevations respectively of a structure adapted to making correction electrodes of quadrature bias.
Figure 11B:
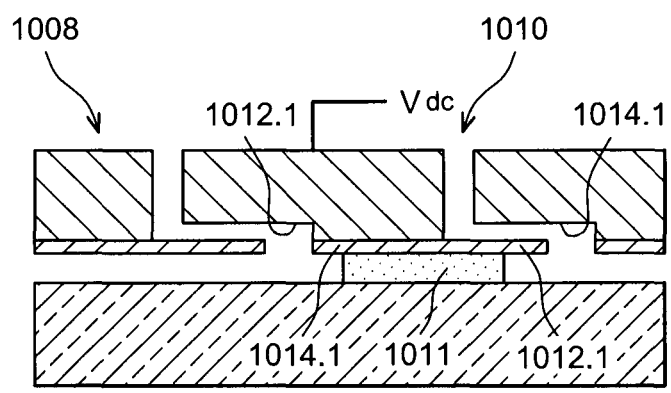

The present invention also makes correction electrodes of quadrature bias for correction of a vertical component of horizontal movement, applicable in a gyroscope X/Y with excitation in the plane. A detailed view of such a system is shown in FIGS. 11A and 11B.

In this example, the fixed part 1010 is received in a notch 1016 formed in the mobile part 1008, such that the edges of the fixed part 1010 are opposite the edges of the notch. During displacement of the fixed part in the direction of the double arrow F, a lateral edge of the notch 1016 moves closer to the lateral edge opposite the fixed part and the other lateral edge moves away from the other lateral edge of the fixed part.

The fixed part 1010 comprises an upper electrode 1012.1 formed in the second layer of the stack and a lower electrode 1012.2 formed in the first layer of the opposite stack relative to the fixation zone on the substrate.

The mobile part 1008 has a lower electrode 1014.1 formed in the first layer, and an upper electrode 1014.2 formed in the second layer.

The sacrificial layer 1011 is interposed between the stack and the substrate.

The application of static voltage to the bias compensation electrode generates a force according to Z proportional to displacement Ax which compensates for mechanical quadrature bias (led for example by a non-diagonal stiffness coefficient of the suspension arms of the masses) generating an elastic return force according to Z in the form of $Fz=-kxz.x$. The static voltage is regulated such that it cancels out the parasite vibration according to Z. Vibration resulting from the masses occurs only in the preferred direction x.

The out-of-plane sensors and the actuators can comprise an active part formed by more than two layers, such as the structure illustrated in FIG. 6.

The production processes described in FIGS. 7A to 7G and 8A to 8I apply fully to making MEMS or NEMS structures with out-of-plane displacement.

The invention claimed is:

1. A process for producing a micromechanical structure comprising a substrate and a stack of at least one first and one second active layer arranged on the substrate with the second active layer being above the first active layer, a mobile part formed in the stack and a fixed part relative to the substrate formed in the stack, the mobile part comprising portions of said at least two layers of said stack and the fixed part comprising portions of said at least two layers of said stack, the fixed part and the mobile part comprising opposite faces substantially parallel to a medium plane of the structure, a first face of the mobile part being under a first face of the fixed part such that the first face of the mobile part directly faces and is opposite the first face of the fixed part and a second face of the mobile part being above a second face of the fixed part such that the second face of the mobile part directly faces and is opposite the second face of the fixed part, and a free space is provided between at least one of the first faces of the mobile part and the fixed part or the second faces of the mobile part and the fixed part, said process comprising: from a stack of at least one first sacrificial layer and of the first active layer:

a) structuring the first active layer so as to reveal the first sacrificial layer in at least two zones, b) forming a second sacrificial layer on the first active layer, the second sacrificial layer covering said zones revealing the first sacrificial layer and passing through the first active layer and being in contact with said first sacrificial layer in said zones, c) structuring said second sacrificial layer so as to obtain portions of a second sacrificial layer on the first active layer at the level of said zones where the second sacrificial layer passes through the first active layer, d) forming a second active layer on the portions of the second structured sacrificial layer and on the first active layer with which the second active layer is directly in contact, the material of the second sacrificial layer able to be etched selectively relative to those of the first and second active layers, e) structuring first and second active layers to present the portions of the second structured sacrificial layer and the first sacrificial layer, f) eliminating the portions of the second structured sacrificial layer between the opposite faces of the first and second active layers, and g) at least partially eliminating the first sacrificial layer releasing the mobile part, wherein step e) occurs after step a).

2. The process for producing a micromechanical structure as claimed in claim 1, in which the material of the second sacrificial layer is oxide.

3. The process for producing a micromechanical structure as claimed in claim 1, in which the second active layer is formed by epitaxial growth.

4. The process for producing a micromechanical structure as claimed in claim 1, in which releasing of the mobile part is obtained with hydrofluoric acid.

5. The process for producing a micromechanical structure as claimed in claim 1, in which each of the active layers of the stack is silicon or SiGe.

6. The process for producing a micromechanical structure as claimed in claim 1, in which the first sacrificial layer is silicon oxide, and forms part of a SOI substrate.

7. A process for producing a micromechanical structure comprising a substrate and a stack of a first, of a second and of a third active layer arranged on the substrate with the third active layer being above the second active layer being above the first active layer, a mobile part formed in the stack and a fixed part relative to the substrate formed in the stack, the mobile part comprising portions of said at least two layers of said stack and the fixed part comprising portions of said at least two layers of said stack, the fixed part and the mobile part comprising opposite faces substantially parallel to a medium plane of the structure, a first face of the mobile part being under a first face of the fixed part such that the first face of the mobile part directly faces and is opposite the first face of the fixed part and a second face of the mobile part being above a second face of the fixed part such that the second face of the mobile part directly faces and is opposite the second face of the fixed part, and a free space is provided between at least one of the first faces of the mobile part and the fixed part or the second faces of the mobile part and the fixed part, said process comprising: from a stack of at least one first sacrificial layer and of the first active layer:

a') structuring the first active layer so as to reveal the first sacrificial layer in at least two zones, b') forming a second sacrificial layer on the first active layer, the second sacrificial layer covering the zones revealing the first sacrificial layer and passing through the first active layer and being in contact with said first sacrificial layer, c') structuring said second sacrificial layer so as to obtain at least one first and a second portion on the first active layer, at the level of some zones corresponding to the zones where at least one of the first faces of the mobile part and the fixed part or the second faces of the mobile part and the fixed part are opposite and where the second sacrificial layer passes through the first active layer, d') formatting the second active layer on the first and second portions of the second structured sacrificial layer and on the first active layer, the second active layer being directly in contact with the first active layer, e') structuring the second active layer at least in some zones located at the level of the first portion so as to reveal said first portion, f') forming a third sacrificial layer on the second active layer, g') structuring the third sacrificial layer so as to obtain at least one portion of said third sacrificial layer at least partially covering the zone revealing the first portion of the second sacrificial layer and passing through the second active layer and being in contact with said first portion of the second sacrificial layer, h') forming the third active layer on the at least one portion of the third structured sacrificial layer and on the second active layer with which the third active layer is directly in contact, the materials of the second and third sacrificial layers able to be etched selectively relative to those of the first, second and third active layers, i') structuring the three active layers to present the portions of the second and third sacrificial layers and the first sacrificial layer, j') eliminating the portions of the second and third sacrificial layers structured between the opposite faces of the first and second active layers and between the second and third active layers, and k') at least partially eliminating the first sacrificial layer releasing the mobile part, wherein step i') occurs after step a').

8. The process for producing a micromechanical structure as claimed in claim 7, in which during step c'), the first portion of the second sacrificial layer comprises a surface lower than that of the second portion, the first portion having a surface near the section of the portion of second sacrificial layer passing through the first active layer.

9. The process for producing a micromechanical structure as claimed in claim 7, in which the material of at least one of the second sacrificial layer or the third sacrificial layer is oxide.

10. The process for producing a micromechanical structure as claimed in claim 7, in which at least one of the second active layer or the third active layer is formed by epitaxial growth.

11. The process for producing a micromechanical structure as claimed in claim 7, in which each of the active layers of the stack is silicon or SiGe.

12. The process for producing a micromechanical structure as claimed in claim 7, in which the first sacrificial layer is silicon oxide, and forms part of a SOI substrate.

* * * * *